April 4, 1961 T. A. TELFER 2,977,672

METHOD OF MAKING BONDED WIRE CIRCUIT

Filed Dec. 12, 1958 2 Sheets-Sheet 1

Inventor:
Thomas A. Telfer,
by Roe D McBurnett
His Attorney.

April 4, 1961 T. A. TELFER 2,977,672

METHOD OF MAKING BONDED WIRE CIRCUIT

Filed Dec. 12, 1958 2 Sheets-Sheet 2

Inventor:
Thomas A. Telfer,
by Roe D McBurnett
His Attorney.

United States Patent Office 2,977,672
Patented Apr. 4, 1961

2,977,672

METHOD OF MAKING BONDED WIRE CIRCUIT

Thomas A. Telfer, Utica, N.Y., assignor to General Electric Company, a corporation of New York Filed Dec. 12, 1958, Ser. No. 780,126

2 Claims. (Cl. 29—155.5)

This invention relates to electronic circuits, and more particularly to bonded wire circuits and a method for facilitating automated assembly of bonded wire circuits.

Recent years have seen a tremendous increase in interest in mass production techniques for electrical circuits and electronic component assemblies. Among the techniques which have found extensive commercial application have been chassis circuits involving point to point wiring, the use of terminals mounted in insulated sheets in which components are connected by point to point wiring, and the use of printed wiring boards and printed circuit techniques. For reasons of simplicity, economy and adaptability to mass production techniques, the most attractive of these several techniques has been that of printed wiring boards.

While printed wiring board techniques have advanced the art of electronic assembly, there have been numerous problems which have prevented these boards from providing ideal solutions to the manufacturer's needs. Among these problems has been that the numerous steps required in fabrication of a printed wiring board take time and money. The expense of printed wiring board fabrication including hand preparation of required art work needs to be reduced. No automated method of producing the art work is known. On short runs, the cost of preparing the hand art work becomes a sizable portion of the cost of the boards. The circuit layout of printed wiring boards is complicated by the fact that care must be taken in the positioning of runs to insure that there is no interference with other required runs.

Also components and circuit connections on printed wiring boards have not always been satisfactory since soldered joints, whether made by hand or by various machine techniques, have not always had the reliability required in precision equipment. Difficulty is experienced in getting a reliable connection between the eyelets which are presently used in printed wiring boards and the runs on the boards.

Another problem occurs in the repair of printed wiring board assemblies when repair men use a soldering iron to make or correct connections and accidentally produce localized overheating, causing lifting of the runs from the board.

Thus, there has been a need for improving methods of assembling electronic circuits, which methods save time and money, and also offer a high degree of reliability. Also, there is a continuing increase in the demand for electronic circuit assemblies which lend themselves to automated techniques of assembly, especially in short run production.

Accordingly, it is an important object of this invention to provide a method of fabricating electronic circuits which is more adaptable to an automated short run production than are presently used methods.

Another object is to provide a method of fabricating circuits which will result in greater reliability than presently used methods.

Another object is to provide a bonded wire matrix and method for making it which are less expensive and less complex than those of the prior art.

Another object is to provide a method of electronic circuit assembly which results in a smaller, lighter package.

Briefly stated, in accordance with one aspect of this invention there is provided a method of achieving an electronic circuit matrix by welding or otherwise bonding together electrical conductors separated by an insulating member, such method providing for piercing the insulating member during the same welding or bonding operation which provides the electrical and physical connection between the conductors. Unwanted portions of the conductors are then removed from the assembly and components connected as desired to complete the electronic circuit assembly.

Advantages are offered by this invention in the development of a circuit since a matrix can be made automatically from a machine which would convert electrical signals from a punched tape to welds at appropriate locations in a matrix, or would fabricate a matrix in response to inputs from signals derived, e.g., from a keyboard control feature of the machine. This cannot be done with printed wiring boards because of the required hand art work and the necessity for using etching processes.

Another advantage of a welded wire circuit is that it can be repaired any number of times without damaging the welds or circuit connections.

Figures 1, 2, 4, 5:
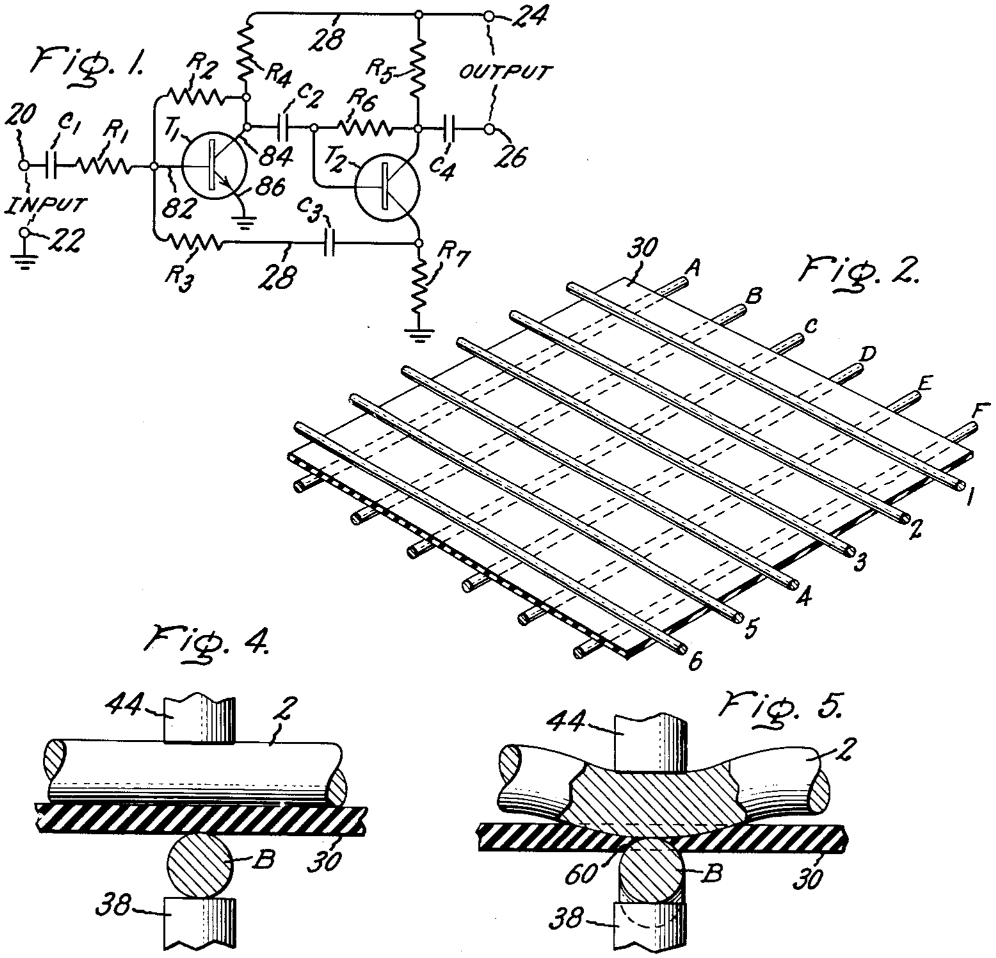
Figure 1 is a circuit diagram illustrating an example of an electronic circuit which can be built up using the teachings of this invention.
Figure 2 is a perspective view illustrating the basic materials used to build up the Figure 1 circuit matrix, including conductors and insulating material in accordance with this invention.
Figures 4, 5 and 6 are enlarged views illustrating the successive stages involved in the application of pressure by the welding electrodes, the piercing of the insulating member, and the bonding of the conductors in a firm electrical connection.
Figure 3:
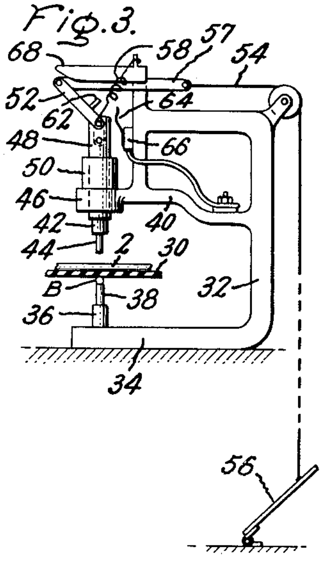
Figure 3 is a schematic drawing showing one type of resistance welding machine which can be used in this invention.

Referring more particularly to the detailed showing of the figures of this invention, and with reference to the several figures of the drawing, there is disclosed in Figure 1 an electronic circuit which is an amplifier circuit comprising input terminals 20 and 22 and output terminals 24 and 26. Capacitors C1, C2, C3 and C4, resistors R1, R2, R3, R4, R5, R6 and R7, transistors T1 and T2 are connected in circuit as shown in Figure 1 by conductors 28.

In order to build up the Figure 1 circuit in accordance with the teachings of this invention, conductors, insulating material and components are assembled in the manner shown in Figures 2 through 8, and as described herein. The insulating material, or member 30, should be of a type which will "cold flow," that is, it will deform under pressure in an appropriate degree. A suitable insulating material is nylon; however, the invention is not limited to the use of this material. As may be seen in Figure 2, selected lengths of conductors A, B, C, D, E and F are placed on one side of the insulating member 30 and selected lengths of conductors 1, 2, 3, 4, 5, 6, etc. are placed on the opposite side of the insulating member 30. These conductors may be held in the desired position by a jig or fixture not shown It will be noted that the conductors on opposite sides of the insulating member lie in parallel planes, but at right angles to each other in the illustrated embodiment. However, it will be recognized by those skilled in the art that these conductors may be placed at some angle other than a right angle, or may even be placed in parallel relation to each other within the teachings of this invention.

The next step in the forming of the electronic circuit matrix is that of welding or otherwise bonding the conductors together in electrically conducting relation at predetermined points on the conductors, the piercing of the insulating member being accomplished during the welding or bonding operation. As illustrated herein, this step of piercing the insulating member 30 during the welding or otherwise bonding of the conductors may be accomplished by the use of a resistance welding machine, an example of which is illustrated schematically in Figure 3. However, it is to be understood that the invention is not limited to the specific type of bonding operation illustrated.

This illustrated resistance welding machine comprises a frame 32 including an arm 34 carrying an electrode holder 36 and an electrode 38. An upper arm 40 of the welding machine frame carries another electrode holder 42 and electrode 44. The electrode holder 42 is slidably mounted within a sleeve 46 projecting from the supporting arm 40 for reciprocal movement. Reciprocal movement of the electrode holder 42 and electrode 44 is effected by a mechanical linkage including a plunger 48 sliding within a chamber 50 and moved by a crank 52 which is in turn moved by a cable 54 actuated by a foot lever 56. Downward movement of the foot lever 56 causes cable 54 to pull the horizontal linkage 57 of crank 52 in the track of guide block 68, thereby effecting a downward movement of the plunger 48 against a biasing spring 58 which causes the electrode 44 to move into contact with one of the conductors 2 on the upper side of the insulating member 30. The conductor B on the lower side of the insulating member 30 is already in contact with the electrode 38.

Figure 6:
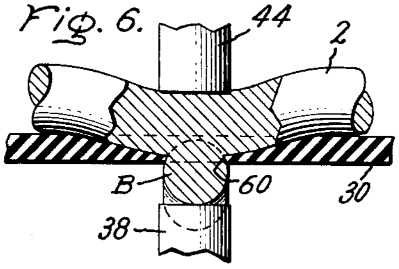

For a blownup view of the assembly at this point reference is made to Figure 4. Continued exertion of pressure on the foot lever 56 will cause the conductors B and 2 to move closer together as shown in Figures 5 and 6, the appropriate pressure resulting in the piercing of the insulating member at the point of contact between the conductors. It has been found that such application of pressure actually causes a small hole 60 to be made in the insulating member 30 and brings the conductors B and 2 into actual physical contact.

The conductor position shown in Figure 6 (that is, the conductors are in physical contact) is appropriate for the application of welding voltage which is accomplished by continued pressure on the foot switch 56 by the operator. Such continued pressure causes a pin 62 carried by the crank arm 52 to engage a spring biased lever 64 of a limit switch 66. Closing of the switch 66 closes an electrical circuit energizing the resistance welding apparatus to cause bonding together of the conductors B and 2 through the hole 60 in the insulating member 30.

Figure 7:
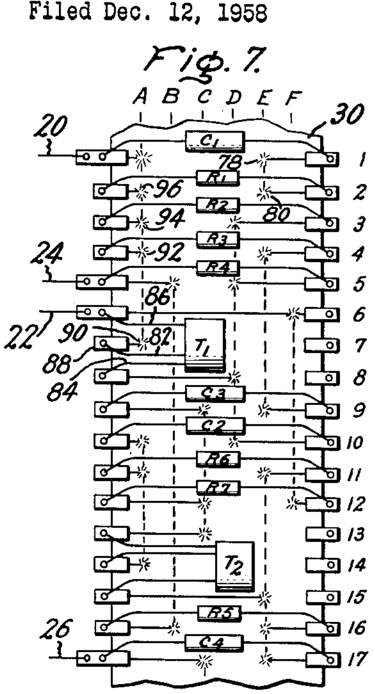
Figure 7 is a view showing the horizontal wires on one side of the bonded wire matrix built up from the Figure 2 materials and showing how the components and leads of the electronic circuit assembly illustrated schematically in Figure 1 are connected in circuit, with unwanted conductor segments cut away.
Figure 8:
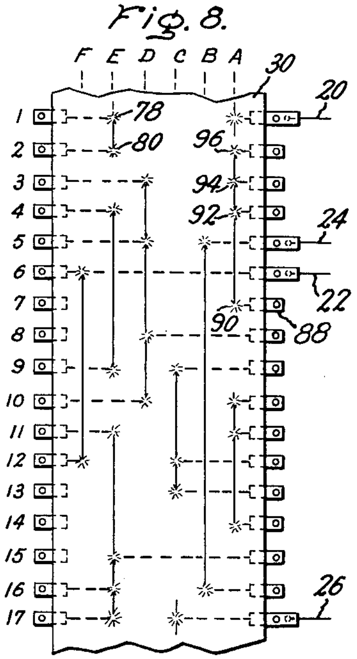
Figure 8 is a view showing the vertical wires of the under side of the bonded wire matrix built up from the Figure 2 materials and showing how the leads of the electronic circuit assembly, illustrated schematically in Figure 1, are connected in circuit, with unwanted conductor segments cut away.

This step of applying pressure to and bonding the conductors through the insulating member may be then repeated as many times as desirable to bond circuit wires together to form the bonded circuit matrix shown in Figures 7 and 8. It will be noted in these figures that vertically arranged conductors A, B, C, D, E and F and horizontal conductors 1 through 17 have been joined at the points shown which are the appropriate points required to build up the circuit shown in Figure 1.

Unwanted portions of the conductors are next cut away from the matrix as the next step in building up the circuit shown in Figure 1. Thus, as can be seen in Figure 7, the portion of the conductor 1 lying between terminal 20 and conductor at weld 78 has been cut away, for example, by cutting pliers or shears. Also, the unwanted portion of conductor 2 has been cut away between conductor A at weld 96 and conductor E at weld 80. Similarly all of the conductor F except that portion connecting conductors 6 and 12, has been cut away, as can be seen in Figure 8.

The electronic components required to complete the Figure 1 circuit are next placed on the matrix and the component leads are soldered or in some other manner electrically connected to the appropriate conductors of the matrix. For example, referring to Figures 7, 9 and 10, capacitor C1 is connected to the opposite ends of conductor 1. This connection may be accomplished by simply soldering the component leads to the ends of conductor 1, e.g., by dip soldering as will be more fully described hereinafter. Similarly resistor R1 is connected to the opposite ends of conductor 2. Resistor R2 is connected to opposite ends of conductor 3. The three terminals of transistor T1 are connected to the left end portions of conductors 6, 7 and 8. In like manner all of the components shown in Figure 1 are laid on the builtup matrix and are connected as shown in Figures 7 and 8. Terminals 20 and 22 are connected respectively to the lefthand ends of conductors 1 and 6. Terminals 24 and 26 are connected respectively to the lefthand ends of conductors 5 and 17. In this manner it will be observed by reference to Figures 7 and 8 that the components and connections required to build up the circuit shown in Figure 1 are now completed. Thus, capacitor C1 is connected by its left lead to the terminal 20. The righthand terminal of capacitor C1 is connected to the conductor 1 which in turn by virtue of welds 78 and 80 and over the path provided by conductor E, is connected to conductor 2. Conductor 2 in turn is connected to resistor R1.

Considering another component, for example, transistor T1, it will be observed from Figure 1 that one terminal 82 of the transistor is connected to a common point between resistors R1, R2 and R3, and that another terminal 84 of the transistor T1 is connected to the common point between the resistor R2, R4 and capacitor C2. The other terminal 86 of transistor T1 is connected to terminal 22 to ground.

These connections may be traced in Figures 7 and 8 as follows. Transistor terminal 82 is connected to conductor 7 by way of comb tooth 88. Conductor 7 is connected to conductor A through weld 90. Thus through welds 92, 94 and 96 and through conductor A, this transistor terminal 82 is connected respectively to resistors R3, R2 and R1 via conductors 4, 3 and 2. In like manner the connections made by virtue of the bonded wire circuit described above can be traced in Figures 7 and 8 to show the circuit connections required by the Figure 1 schematic diagram.

The manner of electrically connecting the component leads to the ends of the matrix conductors may be accomplished (see Figures 9 and 10) by the use of a comb 70 made of conductive material and having teeth 72 with holes 73 therein spaced to match the projecting ends of the conductors 1 through 17 (see Figures 7 and 8). The individual teeth 72 of the comb 70 are welded to the respective ends of the conductors 1 through 17 by positioning the anchor wire 76 parallel to and spaced from conductor A. The unwanted portions of the anchor wire 76 lying between the teeth 72 of the comb 70 are now cut and removed since they have served as a wire anchor for positioning the conductors for welding to the comb teeth. The ends 74 (shown in Figure 10) of the component leads are then threaded through holes 73 of the comb teeth and the unwanted portions of the comb 70 are next cut out to leave only the comb teeth as shown in Figures 7 and 8. Thereafter the entire edge of the matrix is dipped in solder to complete the electrical connection between the component leads, the teeth 72 of the brass comb 70 and the various conductors.

Figures 9, 10, 11, 12:
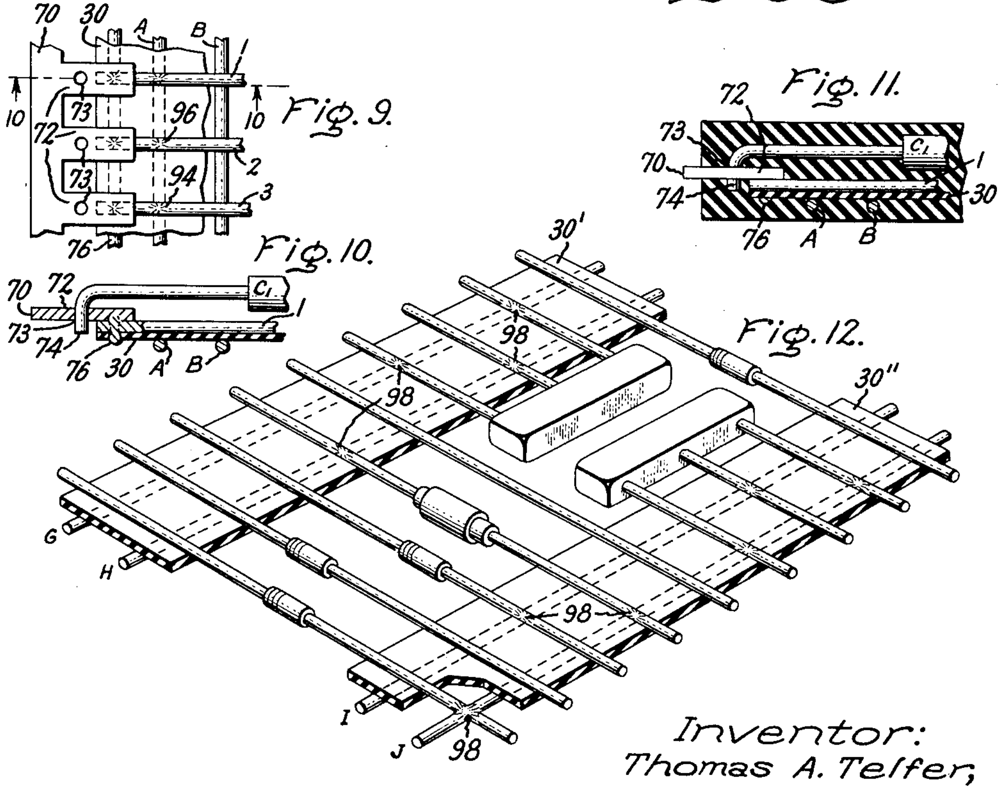
Figure 9 is an enlarged plan view of the upper left portion of Figure 7 and showing one method of securing the component leads.
Figure 10 is a view shown in elevation and taken on line 10—10 of Figure 9.
Figure 11 is a view of Figure 10 showing the leads and components of the matrix completely incapsulated in an insulating material.
Figure 12 is a perspective view showing a different type of electronic circuit assembled in accordance with this invention.

When desired, the entire bonded wire circuit assembly may be incapsulated in a mold of insulating material, for example, as shown in Figure 11.

This incapsulation of the bonded wire circuit assembly facilitates its use in completed electronic apparatus assemblies requiring a plurality of sub-assemblies or circuits. It will be noted that the bonded wire circuits lend themselves to being arranged one on top of the other, or one by the side of the other, or in cylindrical configurations. While these types of applications for the incapsulated bonded wire circuits of this invention are useful and have definite advantages, it is to be understood that other arrangements of the assemblies can be made within the teachings of this invention.

Another example of circuit arrangement which is well adapted to apply the principles of this invention is shown in Figure 12. In Figure 12 there are two insulating members, 30′ and 30″ arranged in spaced relation to the same plane, and having conductors G, H, I and J arranged underneath the insulating members. Electronic components are placed so that the components lie between the insulating members 30′ and 30″, and so that the component leads lie on the insulating members 30′ and 30″ on opposite sides thereof from the conductors G, H, I and J. The circuit connections are then made in accordance with the teachings of this invention as described above so that the component leads are connected at appropriate points on the conductors G, H, etc., for example, by welds 98. By completing the welds and circuit connections in the manner taught herein, a circuit can be built up to satisfy any electrical schematic diagram, for example, of the type shown in Figure 1. Also the entire builtup circuit shown in Figure 12 can be incapsulated in an insulating material in the manner shown in Figure 11, if desired.

While particular embodiments of the invention have been illustrated and described, modifications thereof will readily occur to those skilled in the art. For example, the embodiments disclosed have dealt with two types of arrangements, namely, joining conductors to form a matrix, and then joining component leads to the matrix, and joining component leads on one side of an insulating member to circuit conductors on opposite sides. It will be understood that the invention can be practiced in other ways, e.g., by the direct joining of multiple component leads placed on opposite sides of an insulating member. It should be understood, therefore, that the invention is not limited to the particular arrangements disclosed, but that the appended claims are intended to cover all modifications which do not depart from the true spirit and scope of the invention.

What I claim as new and desire to secure by Letters Patent of the United States is:

1. The method of forming an electronic circuit matrix comprising placing two or more electrical conductors in proximity, separating said conductors with a pressure deformable insulating member consisting of a sheet of cold flow material, applying pressure across said conductors to pierce said insulating member by forcing said conductors into surface contact, and bonding said conductors at the area of contact.

2. The method of forming an electronic circuit matrix comprising placing two or more electrical conductors in proximity, separating said conductors with a continuous, pressure deformable insulating member, piercing said insulating member by applying pressure to said conductors and performing a welding operation at a conductor junction by forming a weld while said insulating material is pressure deformed to provide surface contact of said conductors.

References Cited in the file of this patent

UNITED STATES PATENTS

| | | |
|---|---|---|
| 1,652,634 | Oliver | Dec. 13, 1927 |
| 2,019,625 | O'Brien | Nov. 5, 1935 |
| 2,872,565 | Brooks | Feb. 3, 1959 |

OTHER REFERENCES

Publication I: "New Advances in Printed Circuits," U.S. Dept. of Commerce National Bureau of Standards Miscellaneous Publication 192, November 22, 1948 (pages 48–50 relied on).

Publication II: "Selectron Harness System," Tape Cable Corp. Engineering Bulletin No. 9, November 1958, published by Tape Cable Corporation, 790 Linden Ave., Rochester 10, N.Y.